US012701894B2

(12) United States Patent
Yan

(10) Patent No.: US 12,701,894 B2
(45) Date of Patent: Aug. 4, 2026

(54) DISPLAY PANELS AND DISPLAY DEVICES INCLUDING PHOTOSENSITIVE LAYER IN NON-LIGHT-EMITTING AREA

(71) Applicant: WUHAN CHINA STAR OPTOELECTRONICS SEMICONDUCTOR DISPLAY TECHNOLOGY CO., LTD., Wuhan (CN)

(72) Inventor: Yuan Yan, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 280 days.

(21) Appl. No.: 18/279,610

(22) PCT Filed: Aug. 11, 2023

(86) PCT No.: PCT/CN2023/112753
§ 371 (c)(1),
(2) Date: Aug. 31, 2023

(87) PCT Pub. No.: WO2025/025264
PCT Pub. Date: Feb. 6, 2025

(65) Prior Publication Data
US 2025/0098475 A1     Mar. 20, 2025

(30) Foreign Application Priority Data

Aug. 2, 2023     (CN) .......................... 202310968422.7

(51) Int. Cl.
*H10K 59/60*          (2023.01)
*H10K 59/122*        (2023.01)
(Continued)

(52) U.S. Cl.
CPC ........... *H10K 59/60* (2023.02); *H10K 59/122* (2023.02); *H10K 59/38* (2023.02); *H10K 59/80524* (2023.02); *H10K 59/8792* (2023.02)

(58) Field of Classification Search
CPC .... H10K 59/60; H10K 59/122; H10K 59/805; H10K 59/40
See application file for complete search history.

(56) References Cited

U.S. PATENT DOCUMENTS

2020/0124932 A1*   4/2020   Yang ................. G02F 1/136286
2021/0151524 A1    5/2021   Tang et al.
(Continued)

FOREIGN PATENT DOCUMENTS

CN          109858443 A     6/2019
CN          112992951 A     6/2021
(Continued)

OTHER PUBLICATIONS

International Search Report in International application No. PCT/CN2023/112753, mailed on Apr. 10, 2024.
(Continued)

*Primary Examiner* — Nduka E Ojeh
(74) *Attorney, Agent, or Firm* — PV IP PC; Christopher S. Ruprecht; Wei Te Chung

(57)          ABSTRACT

A display panel includes a substrate, a first semiconductor layer, an insulating isolation layer, a photosensitive layer, a second semiconductor layer and a light-emitting layer. The first semiconductor layer includes a first electrode in a non-light-emitting area. The insulating isolation layer includes a first opening disposed corresponding to the first electrode. The second semiconductor layer includes a second electrode disposed corresponding to the first opening. A
(Continued)

photosensitive portion is provided between the first electrode and the second electrode and connected to both of them.

20 Claims, 10 Drawing Sheets

(51) Int. Cl.
   *H10K 59/38* (2023.01)
   *H10K 59/80* (2023.01)

(56) References Cited

U.S. PATENT DOCUMENTS

| | | | |
|---|---|---|---|
| 2022/0100982 A1* | 3/2022 | Yao | H10F 39/103 |
| 2023/0105200 A1 | 4/2023 | Zou | |
| 2023/0109051 A1 | 4/2023 | Jeon et al. | |
| 2024/0421173 A1* | 12/2024 | Song | H10F 39/182 |

FOREIGN PATENT DOCUMENTS

| | | |
|---|---|---|
| CN | 115909424 A | 4/2023 |
| CN | 116018018 A | 4/2023 |
| JP | 2008171871 A | 7/2008 |
| WO | 2011065057 A1 | 6/2011 |

OTHER PUBLICATIONS

Written Opinion of the International Search Authority in International application No. PCT/CN2023/112753,mailed on Apr. 10, 2024.

German Office Action issued in corresponding German Patent Application No. 11 2023 000 068.9 dated Mar. 15, 2024, pp. 1-9.

Indian Office Action issued in corresponding Indian Patent Application No. 202317073340 dated Apr. 6, 2026, pp. 1-10.

* cited by examiner

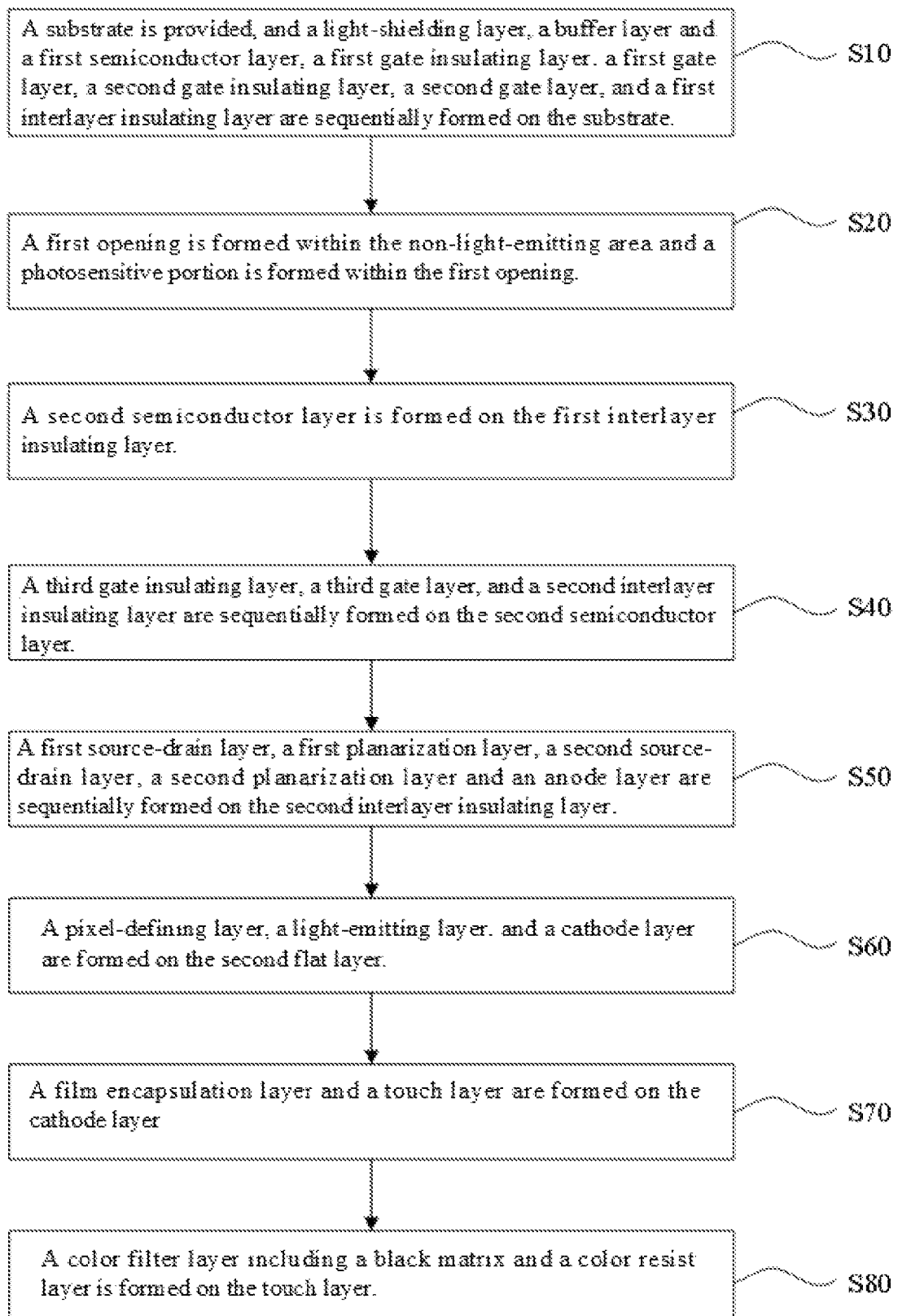

A substrate is provided, and a light-shielding layer, a buffer layer and a first semiconductor layer, a first gate insulating layer. a first gate layer, a second gate insulating layer, a second gate layer, and a first interlayer insulating layer are sequentially formed on the substrate. — S10

A first opening is formed within the non-light-emitting area and a photosensitive portion is formed within the first opening. — S20

A second semiconductor layer is formed on the first interlayer insulating layer. — S30

A third gate insulating layer, a third gate layer, and a second interlayer insulating layer are sequentially formed on the second semiconductor layer. — S40

A first source-drain layer, a first planarization layer, a second source-drain layer, a second planarization layer and an anode layer are sequentially formed on the second interlayer insulating layer. — S50

A pixel-defining layer. a light-emitting layer. and a cathode layer are formed on the second flat layer. — S60

A film encapsulation layer and a touch layer are formed on the cathode layer — S70

A color filter layer including a black matrix and a color resist layer is formed on the touch layer. — S80

FIG. 5

DISPLAY PANELS AND DISPLAY DEVICES INCLUDING PHOTOSENSITIVE LAYER IN NON-LIGHT-EMITTING AREA

CROSS REFERENCE TO RELATED APPLICATIONS

This application is a continuation of International Application No. PCT/CN2023/112753, filed on Aug. 11, 2023, which claims priority of Chinese patent application No. 202310968422.7 filed on Aug. 2, 2023. The disclosures of the above applications are incorporated herein by reference in their entireties.

TECHNICAL FIELD

The present disclosure relates to display technologies, in particular to display panels and display devices.

BACKGROUND

With the development of display panels, in-screen integration technology has become one of the important development directions of display panels. For example, with in-screen ambient light technology, optical fingerprint technology, temperature sensors or the like, signals such as light signals and heat signals are be converted into electrical signals that can be read in order to obtain the corresponding light signals or heat signals.

For active-matrix organic light-emitting diode (AMOLED) display panels with integrated light control sensors, the process of the AMOLED display panels is complex. If an imaging light path and an optical sensor are additionally integrated within the display panel, the complexity of the process will be further deepened, which reduces the yield of the product.

SUMMARY

In view of the above, one or more embodiments of the present application provide a display panel comprising a light-emitting area and a non-light-emitting area provided between the light-emitting area, the display panel further comprises:

a substrate;

a first semiconductor layer provided on one side of the substrate, wherein the first semiconductor layer comprises a first active portion provided in the light-emitting area and a first electrode corresponding to the non-light-emitting area, the first active portion comprises a first semiconductor material, the first electrode comprises a conductorized first semiconductor material;

an insulating isolation layer provided on one side of the first semiconductor layer away from the substrate, the insulating isolation layer comprises a first opening provided in the non-light-emitting area and corresponding to the first electrode, the first opening exposes a surface of one side of the first electrode away from the substrate;

a photosensitive layer provided on one side of the insulating isolation layer away from the substrate, the photosensitive layer comprises a photosensitive portion provided corresponding to the first opening;

a second semiconductor layer provided on one side of the insulating isolation layer and the photosensitive layer away from the substrate, the second semiconductor layer comprises a second active portion provided in the light-emitting area and a second electrode provided corresponding to the first opening, the second active portion comprises a second semiconductor material, the second electrode comprises a conductorized second semiconductor material, the photosensitive portion is provided between the first electrode and the second electrode;

a light-emitting layer provided on one side of the second semiconductor layer away from the substrate, the light-emitting layer comprises a light-emitting device provided in the light-emitting area.

One or more embodiments of the present application provide a display device comprising a display panel comprising a light-emitting area and a non-light-emitting area provided between the light-emitting area, the display panel further comprises:

a substrate;

a first semiconductor layer provided on one side of the substrate, wherein the first semiconductor layer comprises a first active portion provided in the light-emitting area and a first electrode corresponding to the non-light-emitting area, the first active portion comprises a first semiconductor material, the first electrode comprises a conductorized first semiconductor material;

an insulating isolation layer provided on one side of the first semiconductor layer away from the substrate, the insulating isolation layer comprises a first opening provided in the non-light-emitting area and corresponding to the first electrode, the first opening exposes a surface of one side of the first electrode away from the substrate;

a photosensitive layer provided on one side of the insulating isolation layer away from the substrate, the photosensitive layer comprises a photosensitive portion provided corresponding to the first opening;

a second semiconductor layer provided on one side of the insulating isolation layer and the photosensitive layer away from the substrate, the second semiconductor layer comprises a second active portion provided in the light-emitting area and a second electrode provided corresponding to the first opening, the second active portion comprises a second semiconductor material, the second electrode comprises a conductorized second semiconductor material, the photosensitive portion is provided between the first electrode and the second electrode;

a light-emitting layer provided on one side of the second semiconductor layer away from the substrate, the light-emitting layer comprises a light-emitting device provided in the light-emitting area.

BRIEF DESCRIPTION OF THE DRAWINGS

FIG. 5 is a schematic flowchart of a method of manufacturing a display panel according to one or more embodiments of the present application.

DETAILED DESCRIPTION

Figure 1:
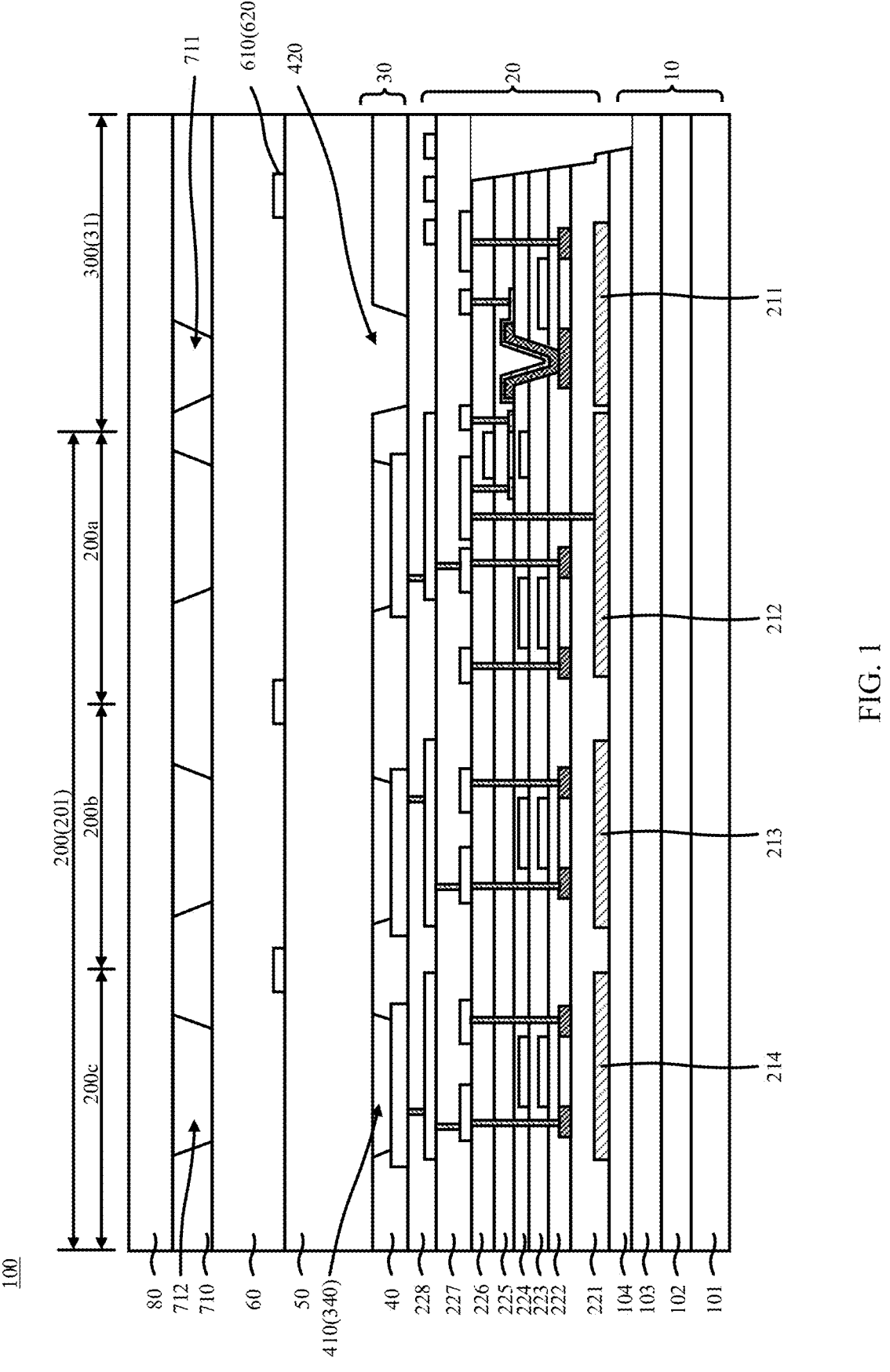
FIG. 1 is a schematic structural diagram of a display panel according to one or more embodiments of the present application.

Some embodiments of the present application will be described in detail below in conjunction with the accompanying drawings. Obviously, the described embodiments are only a part of embodiments of the present application, and not all of the embodiments. Based on the embodiments in the present application, all other embodiments obtained by a person skilled in the art without making creative labor fall within the scope of protection of the present application. In addition, it should be understood that the specific embodiments described herein are used only to illustrate and explain the present application and are not intended to limit the present application. In the present application, in the absence of any indication to the contrary, the use of orientation words such as "upper" and "lower" usually refers to the upper and lower parts of the device in the actual use or working state, specifically refers to the direction of the drawing in the accompanying drawings; whereas the terms "inside" and "outside" refer to the contours of the device.

Referring to FIGS. 1 to 4, the present application provides a display panel 100, the display panel 100 may include a light-emitting area 201 and a non-light-emitting area 301 provided between the light-emitting area 201.

In one or more embodiments, the display panel 100 includes a substrate 10 and an array layer 20 provided on the substrate 10, and the array layer 20 may include a pixel driving portion 200 provided in the light-emitting area 201 and a photosensitive device 300 provided in the non-light-emitting area 301.

In one or more embodiments, the display panel 100 may include the substrate 10, a first semiconductor layer 230 provided on one side of the substrate 10, an insulating isolation layer provided on one side of the first semiconductor layer 230 away from the substrate 10, a photosensitive layer provided on one side of the insulating isolation layer away from the substrate 10, a second semiconductor layer 260 provided on one side of the insulating isolation layer and the photosensitive layer away from the substrate 10, a light-emitting layer provided on one side of the second semiconductor layer 260 away from the substrate 10.

In one or more embodiments, the first semiconductor layer 230 comprises a first active portion 232 provided in the light-emitting area 201 and a first electrode 231d corresponding to the non-light-emitting area 301, the first active portion 232 comprises a first semiconductor material, the first electrode 231d comprises a conductorized first semiconductor material; an insulating isolation layer comprises a first opening 330 provided in the non-light-emitting area 301 and corresponding to the first electrode, the first opening 330 exposes a surface of the first electrode 231d on a side away from the substrate 10; a photosensitive layer comprises a photosensitive portion 320 provided corresponding to the first opening 330; a second semiconductor layer 260 comprises a second active portion 262 provided in the light-emitting area 201 and a second electrode 261a provided corresponding to the first opening 330, the second active portion 262 comprises a second semiconductor material, the second electrode 261a comprises a conductorized second semiconductor material, the photosensitive portion 320 is provided between the first electrode 231d and the second electrode 261a, the first electrode 231d, the photosensitive portion 320, and the second electrode 261a constitute a photosensitive device; the light-emitting layer 340 includes at least one light-emitting device (for example, a light-emitting diode) provided in the light-emitting area 201.

In one or more embodiments, the first electrode 231d may be formed in the same photomasking process as the first active portion 232 in the light-emitting area 201, and the second electrode 261a may be formed in the same photomasking process as the second active portion 262 in the light-emitting area 201; the present application reduces the number of photomasks of the display panel 100 and simplifies the process of the display panel 100 by utilizing the conductorized first semiconductor material and the second semiconductor material to form the first electrode 231d and the second electrode 261a of the photosensitive device in the non-light-emitting area 301, respectively, in the preparation of the film layer of the light-emitting area 201.

It should be noted that the second electrode 261a may be a transparent electrode formed of a transparent material.

It should be noted that the material of the first electrode 231d and the material of the second electrode 261a may be the same or different; for example, the material of the first electrode 231d comprises one of a conductorized low-temperature polysilicon or a metal oxide, and the material of the second electrode 261a comprises another one of a conductorized low-temperature polysilicon or a metal oxide; or, the material of both the first electrode 231d and the second electrode 261a may include one of a conductorized low-temperature polysilicon or a metal oxide.

It should be noted that the display panel 100 may include a plurality of sub-pixels of different light-emitting colors, and the arrangement of the plurality of sub-pixels is not limited by the present application, three differently colored first sub-pixel 200a, second sub-pixel 200b, and third sub-pixel 200c may form a pixel driving portion 200, and one pixel driving portion 200 may be in correspondence with at least one photosensitive device 300, and a plurality of photosensitive devices 300 may be distributed in an array on the display panel 100 in the form of dots, and the following embodiments illustrate the base scheme of the present application with a structure consisting of one pixel driving portion 200 and one photosensitive device 300.

Figure 3:
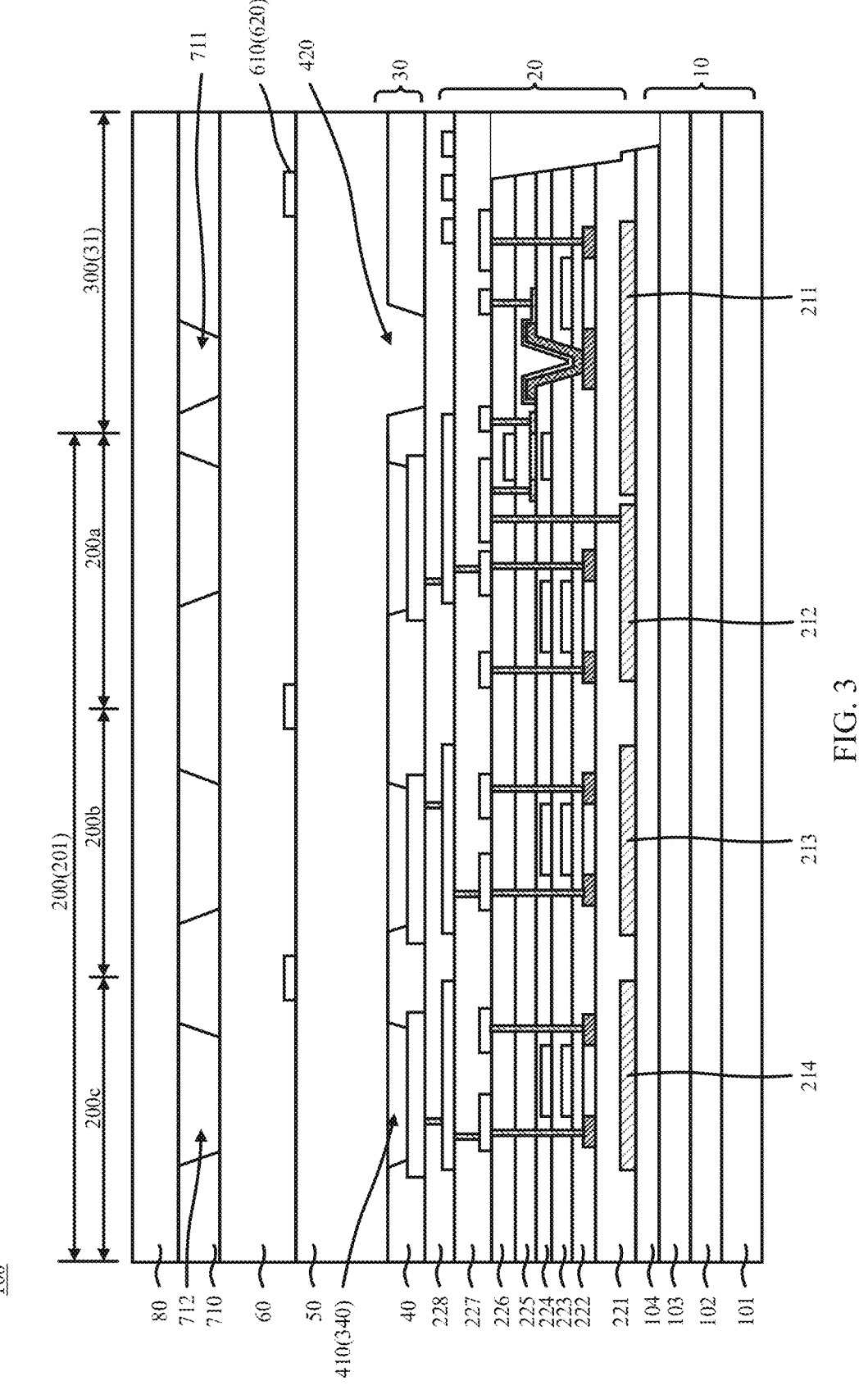
FIG. 3 is a schematic structural diagram of another display panel according to one or more embodiments of the present application.

It should be noted that in the structures of FIGS. 1 and 3, in order to simplify the structure of the accompanying drawings, the structures of the active portions in the second sub-pixel 200b and the third sub-pixel 200c of the present application are briefly illustrated with low-temperature polycrystalline silicon, and the structure of the active portion in the first sub-pixel 200a is illustrated with the structure of the combination of low-temperature polycrystalline silicon and a metal oxide. In the actual product, the structure of the active portion in the second sub-pixel 200b and the third sub-pixel 200c may be the same as the structure of the active portion in the first sub-pixel 200a.

Figure 4:
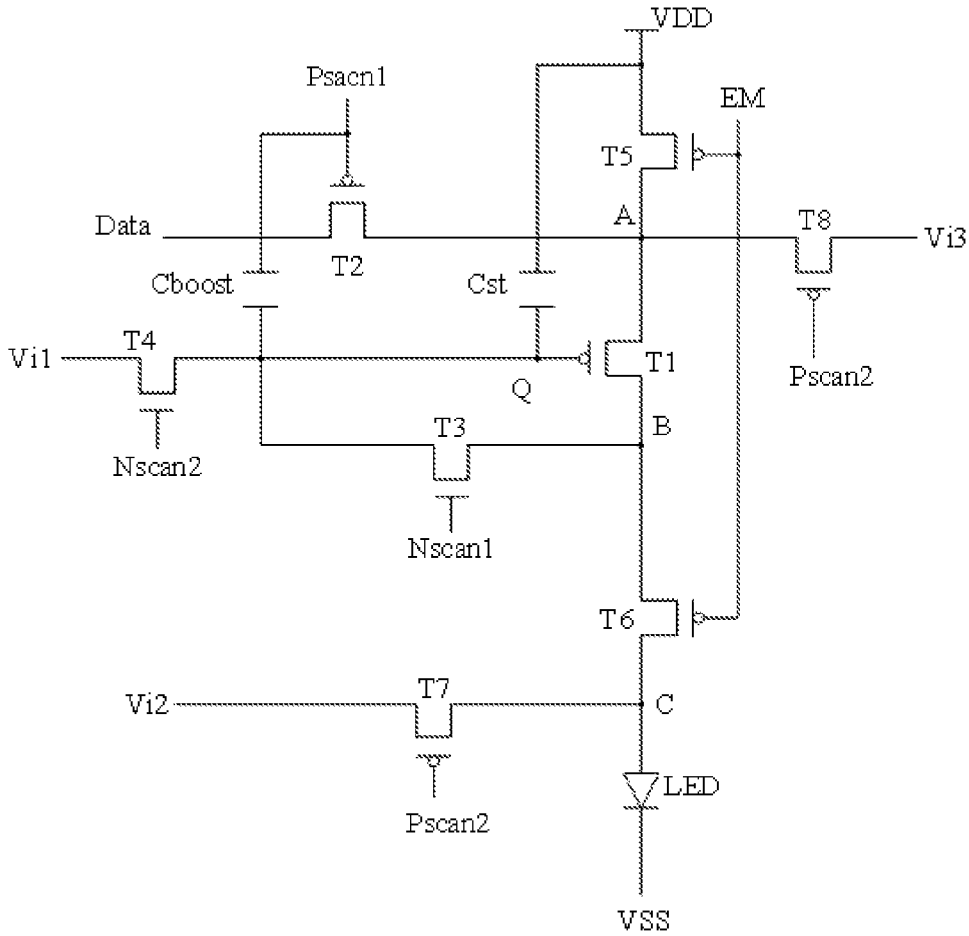
FIG. 4 is a schematic structural diagram of a sub-pixel drive circuit within a sub-pixel in a display panel according to one or more embodiments of the present application.

It should be noted that the sub-pixel drive circuits of the first sub-pixel 200a, the second sub-pixel 200b, and the third sub-pixel 200c may be of a structure such as 7T1C, 7T2C, or 8T2C, for example, FIG. 4 illustrates a diagram of an equivalent circuit structure of a sub-pixel circuit of 8T2C.

Referring to FIG. 4, the sub-pixel circuit 20 may include a drive transistor T1, a switching transistor T2, a compensation transistor T3, a first initialization transistor T4, a first light-emitting control transistor T5, a second light-emitting control transistor T6, a second initialization transistor T7, and a third initialization transistor T8.

Referring to FIG. 4, the switching transistor T2 is connected to the drive transistor T1 at a first node A, the compensation transistor T3 is connected to a first scanning signal line Nscan1, the compensation transistor T3, the drive transistor T1 and the light-emitting device LED are connected at a second node B, the first initialization transistor T4 is connected to a second scanning signal line Nscan2, the first initialization transistor T4, the drive transistor T1 and the compensation transistor T3 are connected at a third node Q, and the first initialization transistor T4 is connected to a first initialization signal line Vi1.

Referring to FIG. 4, the gate of the switching transistor T2 is connected to a third scanning signal line Pscan1, and the first electrode 231*d* of the switching transistor T2 is connected to a data signal line Data; the first electrode 231*d* of the second initialization transistor T7 is connected to a second initialization signal line Vi2, the second electrode 261*a* of the second initialization transistor T7 is connected to the light-emitting device LED at the fourth node C, and the gate of the second initialization transistor T7 is connected to a fourth scanning signal line Pscan2; the first light-emitting control transistor T5 is connected to the drive transistor T1 through the first node A, and the first light-emitting control transistor T5 is connected to the light-emitting control signal line EM; the second light-emitting control transistor T6 is connected to the drive transistor T1 through the second node B; the third initialization transistor T8 is connected to an anode reset line Vi3; and the light-emitting device LED is connected to the constant voltage low level line VSS.

Referring to FIG. 4, the sub-pixel circuit 20 further includes a storage capacitor Cst and a boost capacitor Cboost, one end of the storage capacitor Cst is connected to a constant voltage high level line VDD, and the other end of the storage capacitor Cst is connected to the third node Q; one end of the boost capacitor Cboost is connected to the gate of the switching transistor T2, and the other end of the boost capacitor Cboost is connected to the third node Q.

Referring to FIG. 4, the present application controls the first light-emitting control transistor T5 and the second light-emitting control transistor T6 via the light-emitting control signal line EM, the compensation transistor T3 via the first scanning signal line Nscan1, the first initialization transistor T4 via the second scanning signal line Nscan2, the switching transistor T2 via the third scanning signal line Pscan1, the second initialization transistor T7 and the third initialization transistor T8 via the fourth scanning signal line Pscan2, to achieve normal operation of the display panel 100.

It should be noted that the photosensitive device 300 may be an optical fingerprint identification sensor, and other sensors that require the collection of optical data are also applicable to the present application.

The technical solution of the present application is now described in connection with specific embodiments.

Figure 2:
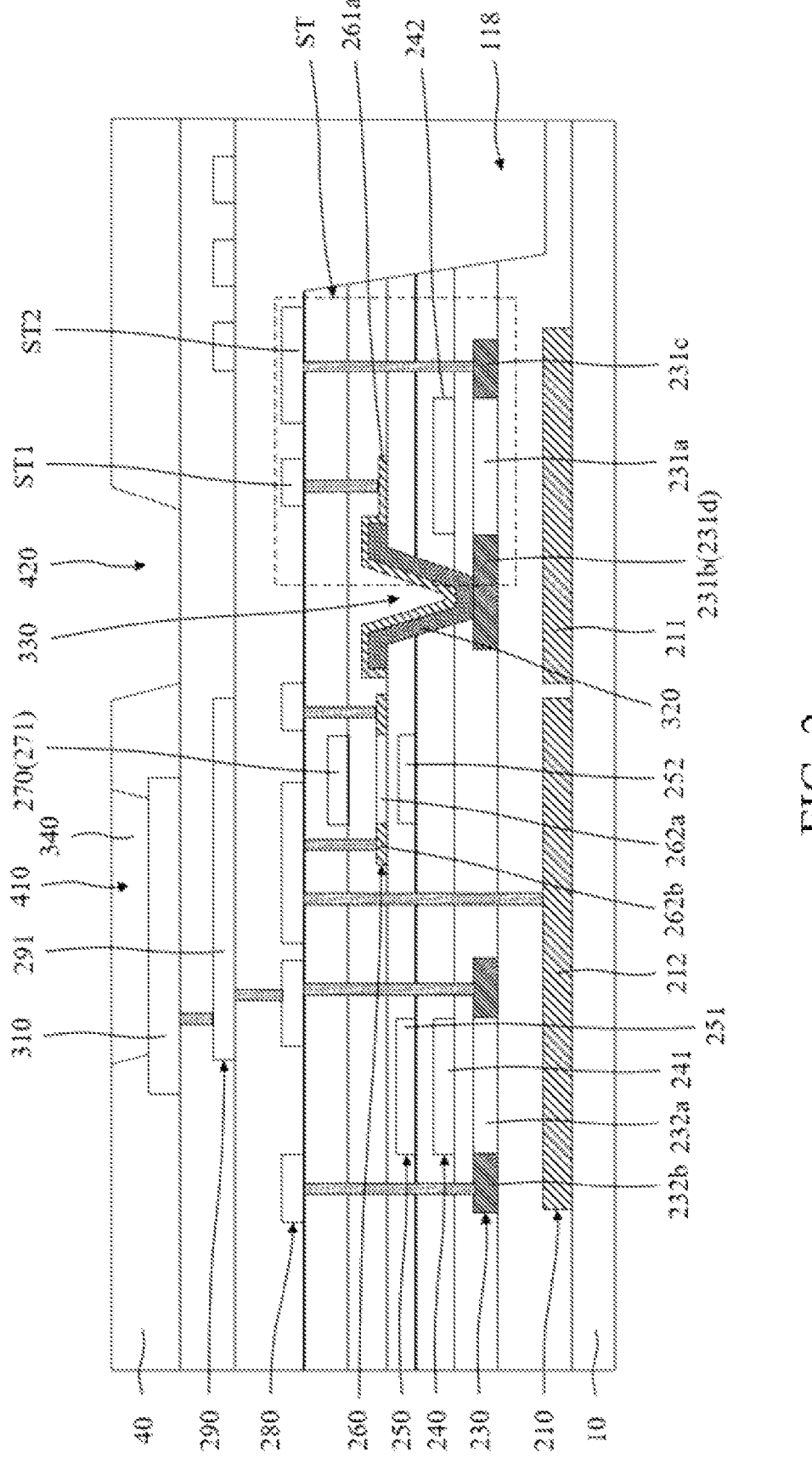
FIG. 2 is an enlarged view of a part of some film layers of the display panel as shown in FIG. 1.

Referring to FIGS. 1 and 2, the display panel 100 may include a substrate 10, an array layer 20 disposed on the substrate 10, a light-emitting device layer 30 disposed on the array layer 20, an encapsulation layer 50 disposed on the light-emitting device layer 30, a touch layer 60 disposed on the encapsulation layer 50, and a color filter layer 70 disposed on the touch layer 60.

In one or more embodiments, when the display panel 100 is a bottom-emitting light-emitting display device or a double-sided emitting light-emitting display device, a transparent substrate may be used. When the display panel 100 is a top-emitting light-emitting display device, a semi-transparent or opaque substrate as well as a transparent substrate may be used, and the display panel 100 of the present application is illustrated by way of example of a top-emitting display device.

In one or more embodiments, the drive circuits of different sub-pixels may be set up differently according to the difference of different color sub-pixels, for example, the material of the semiconductor layer of the thin film transistor in the sub-pixel may include IGZO (Indium Gallium Zinc Oxide), a-Si (Amorphous Silicon), or LTPS (Low-Temperature Polycrystalline Silicon), etc., and the semiconductor layer of at least some of the sub-pixels of the present application may be LTPO, i.e., the combination of IGZO and LTPS. The embodiment in FIG. 1 sets the semiconductor layer of a portion of the thin film transistor of the green sub-pixel to be a combination of IGZO and LTPS, and the semiconductor layer of the blue sub-pixel and the red sub-pixel to be an LTPS structure, in order to illustrate the base scheme of the present application.

In one or more embodiments, the substrate 10 is used to support the respective film layers set on the substrate 10, and the substrate 10 may be made of an insulating material such as glass, quartz, or polymer resin. The substrate 10 may be a rigid substrate or a flexible substrate that can be bent, folded, curled, and the like. Examples of flexible materials for a flexible substrate include, but are not limited to, polyimide (PI).

In one or more embodiments, the substrate 10 may include a first flexible substrate 101, a first resist layer 102, a second flexible substrate 103, and a second resist layer 104 that are stacked, wherein the first flexible substrate 101 and the second flexible substrate 103 may be formed from the same material, such as polyimide, and the first resist layer 102 and the second resist layer 104 may be formed from, for example, an inorganic material including at least one of $SiO_x$ or $SiN_x$.

In one or more embodiments, the first flexible substrate 101 is formed by coating a polymeric material onto a support substrate (not shown) and then curing the polymeric material, the second flexible substrate 103 is formed by coating the same material as the material of the first flexible substrate 101 and curing the material, and the second flexible substrate 103 is formed by the same method as that used to form the first flexible substrate 101. Each of the first flexible substrate 101 and the second flexible substrate 103 may be formed to have a thickness of about 8 μm to about 12 μm. Furthermore, when the substrate 10 is formed from the first flexible substrate 101 and the second flexible substrate 103, small holes, cracks, and the like formed during the fabrication of the first flexible substrate 101 are covered by the second flexible substrate 103 so that the above defects can be removed.

Referring to FIGS. 1 and 2, the array layer 20 may include a light-shielding layer 210, a buffer layer 221, a first semiconductor layer 230, a first gate insulating layer 222, a first gate layer 240, a second gate insulating layer 223, a second gate layer 250, a first interlayer insulating layer 224, a second semiconductor layer 260, a third gate insulating layer 225, a third gate layer 270, a second interlayer insulating layer 226, a first source-drain layer 280, a first planarization layer 227, a second source-drain layer 290, and a second planarization layer 228 that are stacked.

In one or more embodiments, the light-shielding layer 210 is provided on the second resist layer 104, and the light-shielding layer 210 is used to shield external light from entering into the thin film transistor from the bottom, and the material of the light-shielding layer 210 may be composed of a black light-shielding material, such as a black light-shielding metal or a black organic material.

In one or more embodiments, the buffer layer 221 is provided on the light-shielding layer 210, and the buffer layer 221 is used to isolate the light-shielding layer 210 and the upper metal material, and the material of the buffer layer 221 may comprise a compound composition consisting of nitrogen, silicon, and oxygen, for example, a single-layer silicon oxide film layer, or a silicon oxide-silicon nitride stacked layer structure.

In one or more embodiments, the first semiconductor layer 230 is provided on the buffer layer 221, and the second semiconductor layer 260 may be provided on the first interlayer insulating layer 224, and the materials of the first semiconductor layer 230 and the second semiconductor layer 260 may be IGZO (Indium Gallium Zinc Oxide), a-Si (Amorphous Silicon), or LTPS (Low Temperature Polycrystalline Silicon), for example, in the present application, the material of the first semiconductor layer 230 may be LTPS and the material of the second semiconductor layer 260 may be IGZO.

In one or more embodiments, the first gate insulating layer 222, the second gate insulating layer 223, the first interlayer insulating layer 224, the third gate insulating layer 225, and the second interlayer insulating layer 226 are provided on the corresponding metal layer or semiconductor layer, respectively, to be disposed separately with different layers of the metal layer or semiconductor layer; the materials of the first gate insulating layer 222, the second gate insulating layer 223, the first interlayer insulating layer 224, the third gate insulating layer 225, and the second interlayer insulating layer 226 may be composed of an inorganic material with a nitrogen-oxygen-silicon combination or an organic material with flatness.

In one or more embodiments, the first gate layer 240, the second gate layer 250, and the third gate layer 270 are disposed on corresponding insulating layers, the first gate layer 240 includes a first gate 241 disposed within a corresponding sub-pixel for providing a voltage that turns the first semiconductor layer 230 on, the second gate layer 250 includes a second gate 251 disposed within the corresponding sub-pixel, the first gate 241 and the second gate 251 may form a storage capacitor, meanwhile, the second gate layer 250 further includes a first switching gate 252 corresponding to the second semiconductor layer 260, and the third gate layer 270 includes a second switching gate 271 corresponding to the second semiconductor layer 260, the first switching gate 252 and the second switching gate 271 are provided on both sides of the second semiconductor layer 260, and the first switching gate 252 and the second switching gate 271 are used to provide a voltage that turns the second semiconductor layer 260 on; the materials of the first gate layer 240, the second gate layer 250, and the third gate layer 270 may be copper, molybdenum, or a molybdenum-titanium alloy, and the like.

In one or more embodiments, the first source-drain layer 280 is provided on the first planarization layer 227 and the second source-drain layer 290 is provided on the second planarization layer 228, the first source-drain layer 280 includes a source and a drain located within a corresponding sub-pixel, and the second source-drain layer 290 includes a connecting electrode 291 to electrically connect the source or the drain in the first source-drain layer 280 to an anode in the light-emitting device layer 30; the material of the second metal layer may be copper or a molybdenum-titanium alloy, copper or titanium, or the like.

In one or more embodiments, the first planarization layer 227 and the second planarization layer 228 are laid in one whole layer to ensure the flatness of the film layer of the array layer 20; the material of the planarization layer may be composed of an inorganic material with a nitrogen-oxygen-silicon combination or an organic material with flatness.

In one or more embodiments, referring to FIGS. 1 and 2, the light-emitting device layer 30 may further include an anode layer 310 disposed on the second planarization layer 228, a light-emitting layer 340 disposed on the anode layer 310, and a cathode layer disposed on the light-emitting layer 340.

In one or more embodiments, the display panel 100 further includes a pixel-defining layer 40 provided on the array layer 20, and the pixel-defining layer 40 covers the anode layer 310; the anode layer 310 includes a plurality of anodes, the pixel-defining layer 40 includes a plurality of pixel openings 410 corresponding one-to-one with the plurality of anodes, and each pixel opening 410 corresponds to expose an upper surface of an anode, the light-emitting layer 340 may include a plurality of light-emitting devices corresponding one-to-one with the plurality of anodes, the light-emitting devices may be disposed within the corresponding pixel openings 410, and the cathode layer may be disposed in a whole layer on the pixel-defining layer 40 to contact the plurality of light-emitting devices.

In one or more embodiments, the encapsulation layer 50 may cover the cathode layer and successively cover the plurality of pixel openings 410 as well as the plurality of light-emitting devices; wherein the encapsulation layer 50 may comprise at least a first inorganic encapsulation layer 50, a first organic encapsulation layer 50, and a second inorganic encapsulation layer 50 stacked on the pixel-defining layer 40.

In one or more embodiments, the touch layer 60 may include a first touch metal layer and a second touch metal layer disposed on the encapsulation layer 50, and an insulating isolation layer disposed between the first touch metal layer and the second touch metal layer and above and below the first touch metal layer and the second touch metal layer. The touch layer 60 provided by the embodiments of the present application may be of a mutual capacitive type or a self-capacitive type, and the type and structure of the specific touch layer 60 may be selected according to the actual needs.

In one or more embodiments, the color filter layer 70 may include a black matrix 710 and a color resist layer provided on the touch layer 60, and the color resist layer may include a plurality of color resist blocks 721 of different colors, such as a red color resist block 721, a green color resist block 721, and a blue color resist block 721, a plurality of openings corresponding to the pixel driving portion 200 are provided in the black matrix 710 layer, and the plurality of color resist blocks 721 of different colors are provided in the corresponding plurality of openings.

In one or more embodiments, the display panel 100 may further include a photosensitive drive transistor ST disposed within the non-light-emitting area 301; the photosensitive drive transistor ST includes a drive active portion 231 comprising a drive channel 231a and a source connection portion 231b and a drain connection portion 231c disposed on both sides of the drive channel 231a.

In one or more embodiments, the drain connection portion 231c is electrically connected to the drive drain ST2 of the photosensitive drive transistor ST, and at least a portion of the source connection portion 231b is multiplexed as the first electrode 231d; alternatively, the source connection portion 231b is electrically connected to the drive source ST1 of the photosensitive drive transistor ST, and at least a portion of the drain connection portion 231c is multiplexed as the first electrode 231d.

For example, one of the drive source ST1 or the drive drain ST2 of the photosensitive drive transistor ST, i.e., the one that is not multiplexed as the first electrode 231d may be electrically connected indirectly to the second electrode 261a, i.e., other electronic components may also be electrically connected in between.

In one or more embodiments, the drive source ST1 and the drive drain ST2 of the photosensitive drive transistor ST may be formed by the material of the first source-drain layer 280 in the same photomask process.

In the display panel 100 of the present application, referring to FIGS. 1 and 2, the pixel driving portion 200 may include a first pixel driving portion constituting a first sub-pixel 200a, the first sub-pixel 200a may be one of a red sub-pixel, a green sub-pixel, and a blue sub-pixel, and the present embodiment is illustrated by the example of the first sub-pixel 200a being a green sub-pixel.

In the present embodiment, the first pixel driving portion may include a first active portion 232 and a second active portion 262, the first active portion 232 may include a first channel 232a and a first conductor portion 232b disposed on both sides of the first channel 232a, the second active portion 262 may include a second channel 262a and a second conductor portion 262b disposed on both sides of the second channel 262a, and the first active portion 232 and the second active portion 262 are provided non-overlappingly.

In one or more embodiments, the drive active portion 231 and the first active portion 232 are of the same material, and the drive active portion 231 and the first active portion 232 are disposed on a surface of the buffer layer 221, i.e., the drive active portion 231 and the first active portion 232 are both formed from the material of the first semiconductor layer 230 in the same photomask process; the second electrode 261a and the second active portion 262 are of the same material, and the second active portion 262 and at least a portion of the second electrode 261a are disposed on the surface of the first interlayer insulating layer 224, i.e., the second electrode 261a and the second active portion 262 are both formed of the material of the second semiconductor layer 260 in the same photomasking process.

In one or more embodiments, the material of the drive active portion 231 and the first active portion 232 may be low-temperature polysilicon, and the material of the second electrode 261a and the second active portion 262 may be transparent indium gallium zinc oxide.

In one or more embodiments, the second electrode 261a is provided on the photosensitive portion 320, and in order to fully contact the second electrode 261a with the photosensitive portion 320, the second electrode 261a may completely cover the photosensitive portion 320, and a portion of the second electrode 261a may be in contact with a surface of the first interlayer insulating layer 224.

In one or more embodiments, the first semiconductor layer 230 may conductorize the first conductor portion 232b and the first electrode 231d by redoping the active material on both sides of the channel area with boron ions or phosphorus ions to convert to P$^+$ or N$^+$ polysilicon; meanwhile, the second semiconductor layer 260 may apply a process such as boron ion redoping, plasma bombardment, annealing process, etc. to the active material to be conductorized to make the second conductor portion 262b and the second electrode 261a conductive.

The present application makes use of conductorized low-temperature polysilicon and metal oxides to form the first electrode 231d and the second electrode 261a in the photosensitive device 300 by forming the first active portion 232 in the first pixel driving portion at the same time as the first electrode 231d in the photosensitive 300 and forming the active portion 262 in the first sub-pixel 200a at the same time as the second electrode 261a in the photosensitive device 300, and the simultaneous formation of the pixel driving portion 200 and the photosensitive device 300 in the film layer process of the array layer 20 reduces the number of photomasks of the display panel 100 and simplifies the process of the display panel 100.

In the display panel 100 of the present application, referring to FIGS. 1 and 2, the photosensitive device 300 may further include an insulating isolation layer and a first opening 330 opened in the insulating isolation layer, the insulating isolation layer is provided between the drive active portion 231 and the second active portion 262, the first opening 330 extends through the insulating isolation layer, the photosensitive portion 320 may overlap a sidewall of the first opening 330, and the photosensitive portion 320 is electrically connected to one of the two first electrodes 231d through the first opening 330.

In one or more embodiments, the insulating isolation layer may include a first gate insulating layer 222, a second gate insulating layer 223 and a first interlayer insulating layer 224, the first opening 330 may extend through part of the first gate insulating layer 222 and all of the second gate insulating layer 223 and the first interlayer insulating layer 224 to expose part of the first electrode 231d.

In one or more embodiments, the material of the photosensitive portion 320 may be a-Si.

In one or more embodiments, the drive transistor may further include a photosensitive gate 242 provided on the drive active portion 231, the photosensitive gate 242 and the first gate 241 are of the same material, and the photosensitive gate 242 and the first gate 241 are provided on a surface of the first gate insulating layer 222, i.e., both the photosensitive gate 242 and the first gate 241 are formed from the material of the first gate layer 240 in the same photomask process.

In one or more embodiments, the first electrode 231d, the photosensitive portion 320, and the second electrode 261a constitute a photosensitive device, i.e., a photosensitive diode, of the present application; when the incident light is irradiated on the photosensitive diode, the photosensitive portion 320 absorbs the incident light and converts it into a photocurrent; and secondly, the photosensitive gate 242 opens the drive channel 231a of the drive active portion 231, so that the photocurrent is transmitted from the first electrode 231d of the drive active portion 231 to the drain connection portion on the other side of the drive channel 231a, and is transmitted to the corresponding reading module to read the electrical signal.

In one or more embodiments, since the material of the photosensitive portion 320 is amorphous silicon, the thickness of the photosensitive portion 320 is positively correlated with the total amount of light that the photosensitive portion 320 can absorb; that is, when the incident light is irradiated to the photosensitive portion 320, the greater the thickness of the photosensitive portion 320, the higher the upper limit of the total amount of light that can be absorbed by the photosensitive portion 320, and therefore the thickness of the photosensitive portion 320 is increased as much as possible when the size permits to avoid the incident light reaching the upper limit of the absorption of the photosensitive portion 320, which leads to an error in the photodiode measurement; for example, the thickness of the photosensitive portion 320 in one or more embodiments may fill the first opening 330 completely.

In the display panel 100 of the present application, the sidewall of the first opening 330 is angled at an acute angle with the substrate 10 ranging from 30° to 80°. When the acute angle between the sidewall of the first opening 330 and the substrate 10 is less than 30°, the area of the first electrode 231d exposed by the first opening 330 is small under the limited size area, making the contact area between the photosensitive portion 320 and the exposed first electrode 231d smaller, which affects the transmission of photocurrent; and when the acute angle between the sidewall of the first opening 330 and the substrate 10 is more than 80°, the inclination of the sidewall of the first opening 330 is too large, and there may be a risk of discontinuity of the film layer when the film layer deposition of the photosensitive portion 320 is performed.

For the fingerprint identification sensor, it mainly acquires fingerprint information of a user by collecting light data, converting the collected light data into an electrical signal, and reading the electrical signal. However, the light received by the photosensitive portion 320 includes, in addition to the light reflected by the user's finger, stray light incident on the surface from the outside, and therefore, in order to ensure the accuracy of the light data acquisition, the present application also requires a light-shielding layer 210 provided on one side of the photosensitive device 300.

In the display panel 100 of the present application, referring to FIGS. 1 and 2, the light-shielding layer 210 may include a first light-shielding portion (for example, a light-shielding plate) 211 provided between the drive active portion 231 and the substrate 10, and the orthographic projection of the photosensitive portion 320 and the drive channel 231a on the first light-shielding portion 211 is located in the first light-shielding portion 211.

In one or more embodiments, the first light-shielding portion 211 completely covers the photosensitive portion 320 to avoid light entering the interior of the display panel 100 from the side of the substrate 10, ensuring that the light collected by the photosensitive portion 320 is mainly the light reflected by the user's finger, and ensuring the accuracy of the light data collection.

In the display panel 100 of the present application, referring to FIGS. 1 and 2, the light-shielding layer 210 further comprises a second light-shielding portion (for example, a light-shielding plate) 212 disposed between the substrate 10 and the first active portion 232, an orthographic projection of the first active portion 232 on the second light-shielding portion 212 is located in the second light-shielding portion 212 which is used to shield the first active portion 232 in the first sub-pixel 200a.

In one or more embodiments, since the material of the first active portion 232 is low-temperature polycrystalline silicon, the device effect of the first active portion 232 will be affected to a certain extent when light enters into the first channel 232a, and the second light-shielding portion 212 is provided to avoid the light incident from the substrate 10 to the interior of the display panel 100 from entering into the first channel 232a.

In one or more embodiments, the first light-shielding portion 211 and the second light-shielding portion 212 are provided on the surface of the same insulating film layer, i.e., the first light-shielding portion 211 and the second light-shielding portion 212 may be provided on the surface of the second resist layer 104. Meanwhile, the light-shielding layer 210 may also include a third light-shielding portion 213 and a fourth light-shielding portion, and the first light-shielding portion 211, the second light-shielding portion 212, the third light-shielding portion 213 and the fourth light-shielding portion 214 may be arranged at intervals, the third light-shielding portion 213 may be used for blocking the active portion in the second sub-pixel 200b, and the fourth light-shielding portion 214 may be used for blocking the active portion in the third sub-pixel 200c.

In one or more embodiments, the first light-shielding portion 211, the second light-shielding portion 212, the third light-shielding portion 213 and the fourth light-shielding portion 214 may be provided continuously, and the first light-shielding portion 211, the second light-shielding portion 212, the third light-shielding portion 213 and the fourth light-shielding portion 214 may be connected with each other to form a whole light-shielding portion to shield the active portion in the first sub-pixel 200a, the second sub-pixel 200b, the third sub-pixel 200c and the photosensitive device 300, in order to avoid the low-temperature polysilicon and metal oxides in the first sub-pixel 200a, the second sub-pixel 200b, the third sub-pixel 200c and the photosensitive device 300 from being affected by light.

Referring to FIGS. 1 and 2, in order to improve the device effect of the first active portion 232, the second light-shielding portion 212 may be electrically connected to a source or a drain in the first sub-pixel 200a so that a voltage is formed on the second light-shielding portion 212 to turn on the first active portion 232, a driving electric field is formed at both the first gate 241 and the second light-shielding portion 212, increasing the speed of movement of carriers in the first channel 232a, increasing the rate of opening of the first channel 232a, and thereby reducing the response time of the first active portion 232.

In one or more embodiments, since the second light-shielding portion 212 is electrically connected to the source or drain, if the second light-shielding portion 212 is electrically connected to the first light-shielding portion 211, there will be a voltage in the light-shielding portion below the photosensitive device 300, which affects the turning on of the drive active portion 231, so the second light-shielding portion 212 of the present application needs to be provided separately from the first light-shielding portion 211, the third light-shielding portion 213, and the fourth light-shielding portion 214.

In the display panel 100 of the present application, since the second active portion 262 is composed of a metal oxide and the device effect of the second active portion 262 will be affected to a certain extent when light enters into the second channel 262a, the present application may cause an orthographic projection of the second active portion 262 on the second light-shielding portion 212 to be disposed in the second light-shielding portion 212, for example, the structure of FIGS. 1 and 2; or, the orthographic projection of the second active portion 262 on the first light-shielding portion 211 is located within the first light-shielding portion 211, such as the structure of FIG. 3. The provision of the second light-shielding portion 212 in FIGS. 1 and 2 and the first light-shielding portion 211 in FIG. 3 shields the second channel 262a of the second active portion 262, and light incident from the substrate 10 to the interior of the display panel 100 can be prevented from entering into the second channel 262a.

In the display panel 100 of the present application, referring to FIGS. 1 and 2, the length of the drive channel 231a may be smaller than the length of the first channel 232a. Since the length of the channel in the active portion is inversely correlated with the response rate of the active portion, and the width of the channel in the active portion is positively correlated with the response rate of the active portion, the present application, in order to increase the response rate of the photosensitive diode, decreases the length of the drive channel 231a in the photosensitive device 300, so that the length of the drive channel 231a is smaller than the length of the first channel 232a, which improves the opening rate of the drive channel 231a, and thus reduces the response time of the drive active portion 231.

In one or more embodiments, external light may enter the interior of the display panel 100 from the light-out side of the display panel 100, and part of the incident light may be absorbed by the photosensitive device 300, affecting the measurement accuracy of the photosensitive device 300. Therefore, the present application may utilize a black light-shielding material to prepare the pixel-defining layer 40, i.e., except for the pixel opening 410 on the pixel-defining layer 40, all other positions are filled with a black light-shielding material; however, although such a design may avoid the incident light from the outside from entering the photosensitive device 300, the light reflected by the user's finger will also be blocked at the same time, so that the photosensitive device 300 is unable to obtain effective light data.

Referring to FIGS. 1 to 3, the display panel 100 further includes a pixel-defining layer 40 disposed on the array layer 20, and the pixel-defining layer 40 is provided with a second opening 420 corresponding to the photosensitive portion 320. The provision of the second opening 420 allows the light reflected from the user's finger to enter the photosensitive device 300, so that the photosensitive portion 320 can receive the light data to obtain the information about the user's fingerprint.

In one or more embodiments, the second opening 420 is filled with an insulating material, and an orthographic projection of the insulating material in the second opening 420 on the photosensitive portion 320 is located within the photosensitive portion 320. Since an encapsulation layer 50 is formed on the pixel-defining layer 40, the organic and inorganic materials in the encapsulation layer 50 are filled within the second opening 420 to fill the second opening 420; at the same time, in order to ensure the measurement accuracy of the photosensitive device 300, the present embodiment makes the projected area of the photosensitive portion 320 on the substrate 10 larger than the projected area of the second opening 420 on the substrate 10, i.e., the area of the photosensitive portion 320 is increased as much as possible, so that the photosensitive portion 320 receives as much light as possible that is incident to the photosensitive portion 320 from the second opening 420.

In one or more embodiments, similar to the structure of the pixel-defining layer 40, since a plurality of openings corresponding to the pixel driving portion 200 are opened in the layer of the black matrix 710, a plurality of color resist blocks 721 of different colors are provided in the corresponding plurality of openings. Therefore, although the design of the color filter layer 70 prevents incident light from the outside from entering the photosensitive device 300, it also blocks the light reflected by the user's finger, preventing the photosensitive device 300 from obtaining effective light data.

Referring to FIGS. 1 to 3, a third opening 711 corresponding to the second opening 420 is also provided on the layer of the black matrix 710 of the color filter layer 70, and the center point of the third opening 711 and the center point of the second opening 420 may be located on the same straight line perpendicular to the display panel 100. The second opening 420 and the third opening 711 may form a collimated light path, and the light reflected by the user's finger may enter the photosensitive device 300 through the collimated light path, enabling the photosensitive portion 320 to receive the light data and obtain information about the user's fingerprint.

In one or more embodiments, the diameter of the circumcircle of the third opening 711 may be smaller than the diameter of the circumcircle of the second opening 420. The decrease in the diameter of the circumcircle of the third opening 711 reduces the amount of external interference light entering the photosensitive device 300, while the increase in the diameter of the circumcircle of the second opening 420 allows as much incident light as possible through the third opening 711 to enter the photosensitive portion 320.

In one or more embodiments, the diameter of the circumcircle of the third opening 711 may be 2 μm to 20 μm, for example, the diameter of the circumcircle of the third opening 711 may be 4 μm to 10 μm, and the diameter of the circumcircle of the second opening 420 is larger than the diameter of the circumcircle of the third opening 711.

In the display panel 100 of the present application, referring to FIGS. 1 and 3, a plurality of fourth openings 712 corresponding to the pixel driving portion 200 are also provided in the layer of the black matrix 710, and the plurality of fourth openings 712 are filled with a color resist block 721, and one fourth opening 712 corresponds to one pixel opening 410; for example, in one or more embodiments, three fourth openings 712 are filled with a red color resist, a green color resist, and a blue color resist, respectively.

In one or more embodiments, the diameter of the circumcircle of the fourth opening 712 is larger than the diameter of the circumcircle of the third opening 711. Since the fourth opening 712 is filled with the color resist block 721 and the third opening 711 is a channel of the collimated light path, if the diameter of the circumcircle of the third opening 711 is too large, the third opening 711 cannot form a collimated light path with the second opening 420.

In the display panel 100 of the present application, the third opening 711 is filled with a color resist block 721, and the color resist block 721 in the third opening 711 is a blue color resist or a green color resist. The provision of the blue color resist or the green color resist is mainly used to filter the red light reflected by the user's finger.

In the display panel 100 of the present application, referring to FIGS. 1 and 3, the touch metal layer may include a plurality of first touch electrodes, a plurality of second touch electrodes and a bridge member composed of a first touch metal layer and a second touch metal layer, the first touch electrode, the second touch electrode and the bridging member are made of a metal grid, the first touch electrode is insulated from the second touch electrode through a break in the metal grid, the metal grid is made of a plurality of first conductors 610 and a plurality of second conductors 620 crossing to form a plurality of meshes corresponding to at least one sub-pixel.

In one or more embodiments, an orthographic projection of the plurality of first conductors 610 and the plurality of second conductors 620 on the color filter layer 70 is located within the black matrix 710.

In one or more embodiments, the display panel 100 further includes a layer of cover 80 disposed on the color filter layer 70.

Referring to FIG. 5, one or more embodiments of the present application provide a method of manufacturing the display panel 100 comprising a light-emitting area 201 and a non-light-emitting area 301. As shown in FIG. 5, the method of manufacturing the display panel 100 may include steps S10~S80.

In step S10, a substrate 10 is provided, and a light-shielding layer 210, a buffer layer 221 and a first semiconductor layer 230, a first gate insulating layer 222, a first gate layer 240, a second gate insulating layer 223, a second gate layer 250, and a first interlayer insulating layer 224 are sequentially formed on the substrate 10. The first semiconductor layer 230 includes a drive active portion 231 disposed in the non-light-emitting area 301, the drive active portion 231 includes a drive channel 231*a* and a first electrode 231*d* disposed on one side of the drive channel 231*a*, and the material of the first electrode 231*d* includes one of conductorized low-temperature polycrystalline silicon or a metal oxide.

Figure 6A:
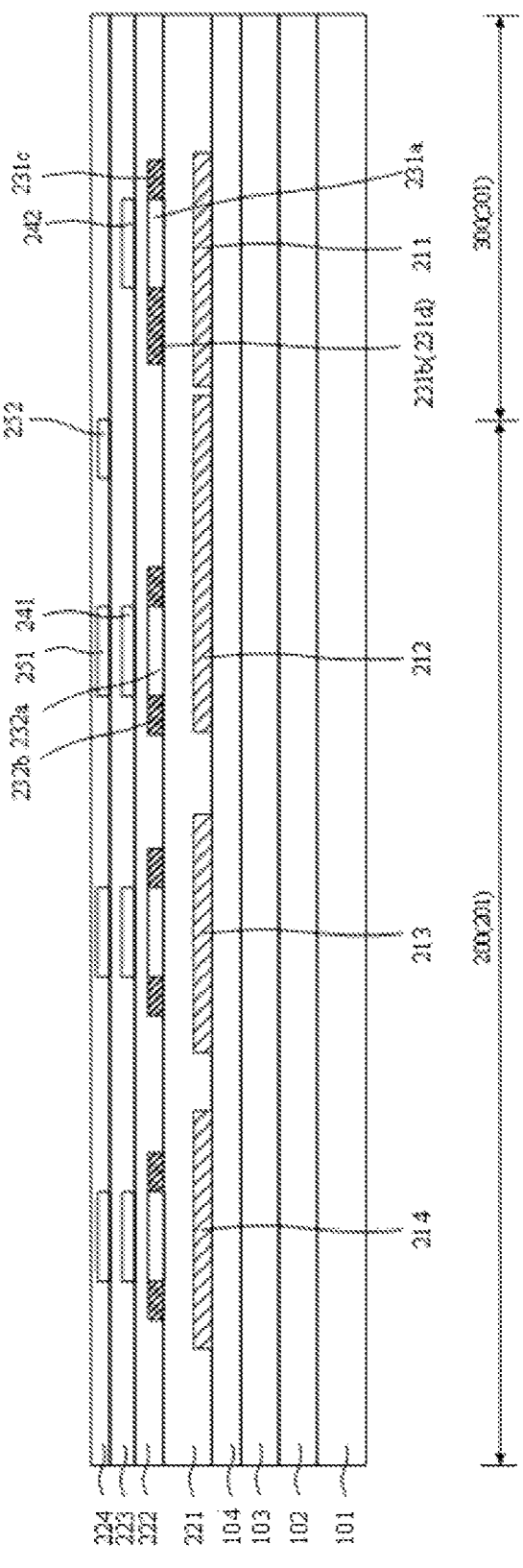
FIGS. 6A to 6E schematically show a process of manufacturing a display panel according to one or more embodiments of the present application.

Referring to FIG. 6A, the substrate 10 may include a first flexible substrate 101, a first resist layer 102, a second flexible substrate 103, and a second resist layer 104 that are stacked, wherein the first flexible substrate 101 and the second flexible substrate 103 may be formed from the same material, such as polyimide, and the first resist layer 102 and the second resist layer 104 may be formed from, for example, an inorganic material comprising at least one of $SiO_x$ or $SiN_x$.

Referring to FIG. 6A, the light-shielding layer 210 is provided on the second resist layer 104, and the light-shielding layer 210 includes a first light-shielding portion 211 disposed in the non-light-emitting area 301 and a second light-shielding portion 212, a third light-shielding portion 213 and a fourth light-shielding portion 214 disposed in the pixel driving portion 200.

Referring to FIG. 6A, the material of the first semiconductor layer 230 may be LTPS, and the first semiconductor layer 230 may include a driver active portion 231 disposed in the non-light-emitting area 301 and a first active portion 232, a fifth active portion, and a sixth active portion disposed in the light-emitting area 201, the first active portion 232, the fifth active portion and the sixth active portion correspond to the second light-shielding portion 212, the third light-shielding portion 213 and the fourth light-shielding portion 214, respectively.

In one or more embodiments, the first semiconductor layer 230 may utilize the first gate layer 240 or the second gate layer 250 as a shielding layer, as well as convert to polycrystalline silicon with $P^+$ or $N^+$ by redoping the active material on both sides of the channel area with boron ions or phosphorus ions in order to conductorize the first conductor portion 232*b* and the first electrode 231*d*.

In step S20, a first opening 330 is formed within the non-light-emitting area 301 and a photosensitive portion 320 is formed within the first opening 330 to connect the photosensitive portion 320 with the first electrode 231*d*, and the first opening 330 passes through a portion of the first gate insulating layer 222 and all of the second gate insulating layer 223 and the first interlayer insulating layer 224 to expose a portion of the first electrode 231*d*.

Figure 6B:
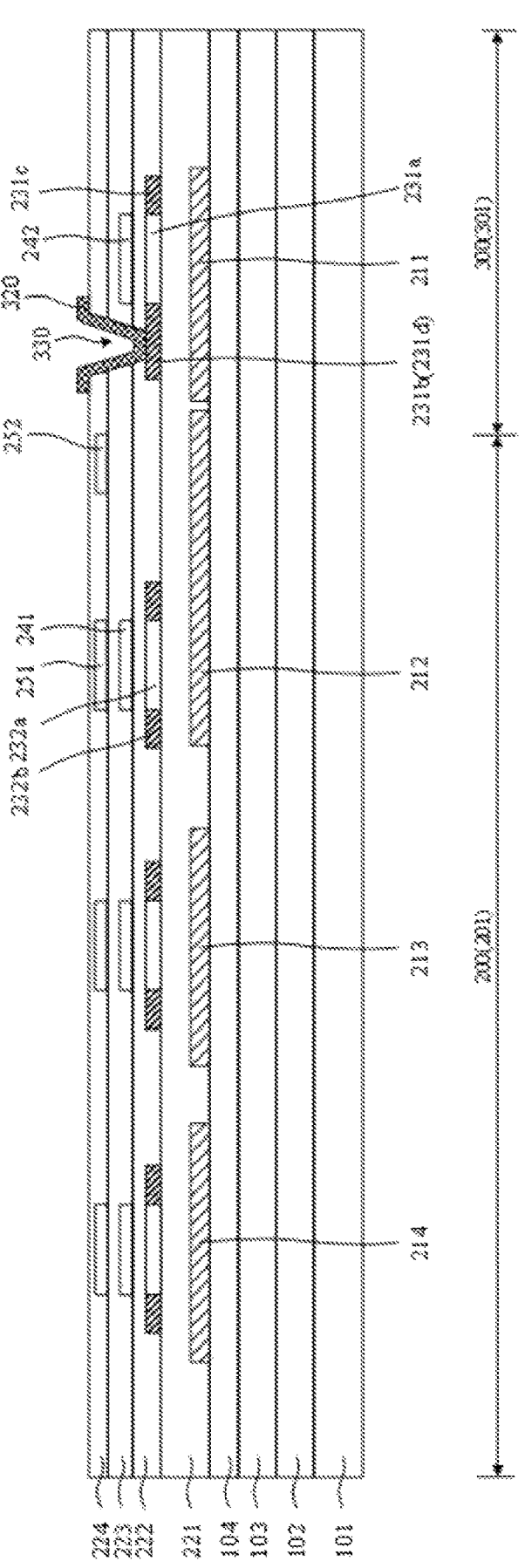

Referring to FIG. 6B, the material of the photosensitive portion 320 may be a-Si, the first electrode 231*d*, the photosensitive portion 320 and the second electrode 261*a* constitute the photosensitive diode of the present application, and when the incident light is irradiated on the photosensitive diode, the photosensitive portion 320 absorbs the incident light and converts it into a photocurrent; and secondly, the photosensitive gate 242 opens the drive channel 231*a* of the drive active portion 231, so that the photocurrent is transmitted from the first electrode 231*d* of the drive active portion 231 to the conductor portion on the other side of the drive channel 231*a*, and is transmitted to the corresponding reading module to read the electrical signal.

In one or more embodiments, the acute angle between the sidewall of the first opening 330 and the substrate 10 ranges from 30° to 80°.

In step S30, a second semiconductor layer 260 is formed on the first interlayer insulating layer 224. The second semiconductor layer 260 includes a second electrode 261*a* disposed within the non-light-emitting area 301, the second electrode 261*a* is connected to the photosensitive portion 320, and the material of the second electrode 261*a* includes another one of conductorized low-temperature polycrystalline silicon or a metal oxide.

Figure 6C:
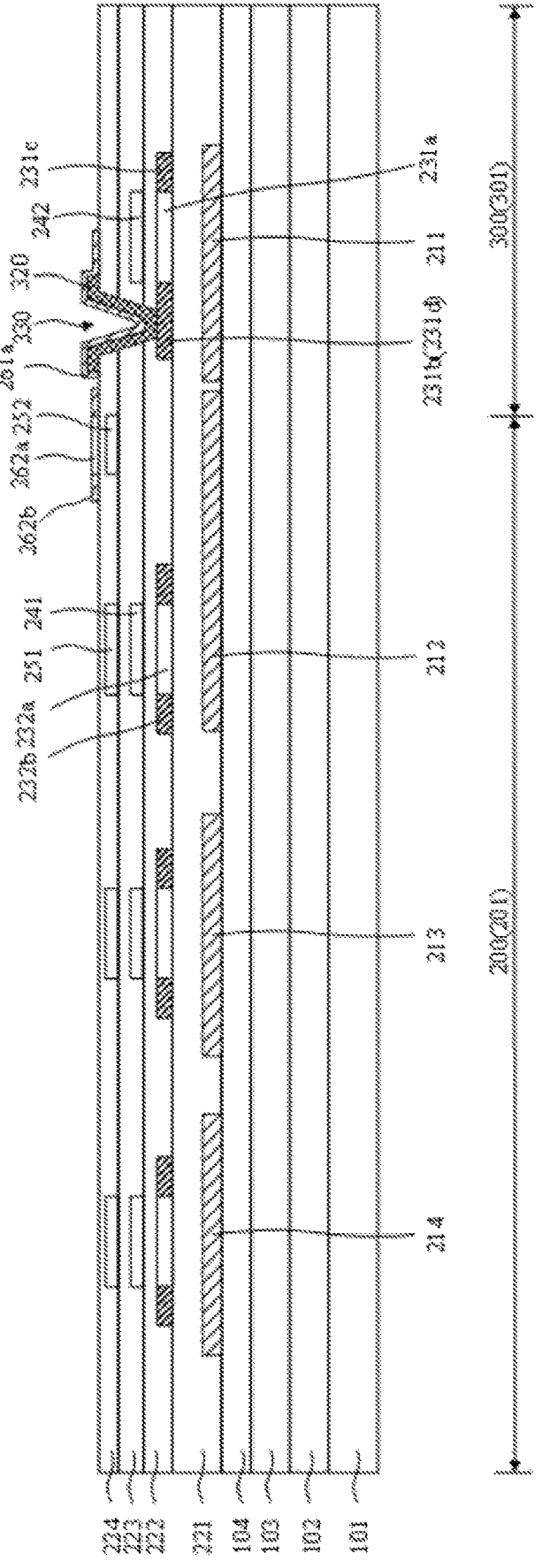

Referring to FIG. 6C, the second semiconductor layer 260 may utilize a subsequent third gate as a shielding layer, and processes such as boron ion redoping, plasma bombardment, annealing processes, etc. may be applied to the active material to be conductorized in order to make the second conductor portion 262*b* and the second electrode 261*a* conductorized.

In step S40, a third gate insulating layer 225, a third gate layer 270, and a second interlayer insulating layer 226 are sequentially formed on the second semiconductor layer 260.

In step S50, a first source-drain layer 280, a first planarization layer 227, a second source-drain layer 290, a second planarization layer 228 and an anode layer 310 are sequentially formed on the second interlayer insulating layer 226.

In step S60, a pixel-defining layer 40, a light-emitting layer and a cathode layer are formed on the second planarization layer 228. A plurality of pixel openings 410 disposed within the light-emitting area 201 and a plurality of second openings 420 disposed within the non-light-emitting area 301 are formed in the pixel-defining layer 40, and the light-emitting layer is disposed within the plurality of pixel openings 410.

Figure 6D:
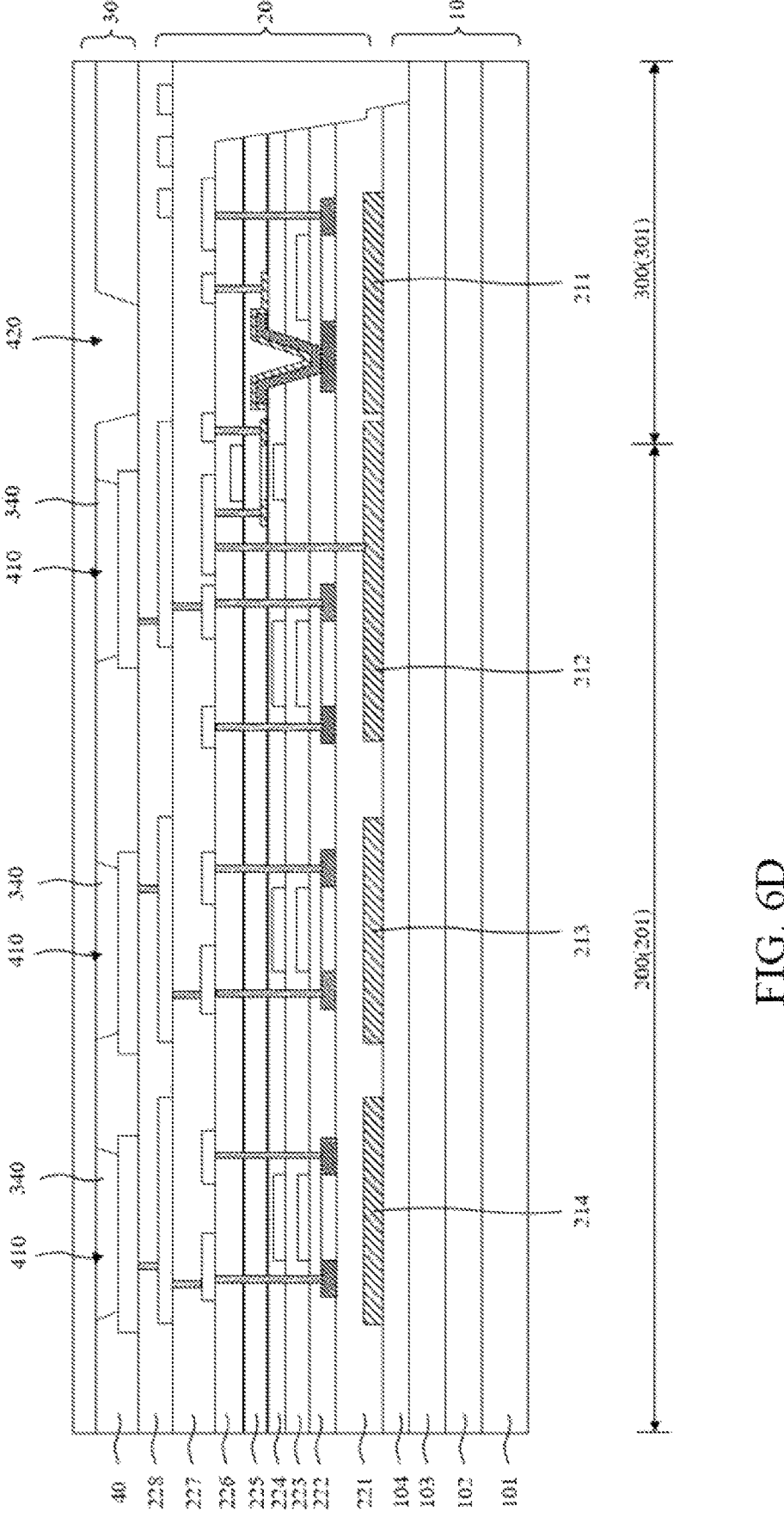

Referring to FIG. 6D, the present application may utilize a black light-shielding material to prepare the pixel-defining layer 40, i.e., except for the pixel openings 410 on the pixel-defining layer 40, all other positions are filled with a black light-shielding material; at the same time, the provision of the second openings 420 allows light reflected by the user's finger to enter the photosensitive device 300, enabling the photosensitive portion 320 to receive the light data to obtain information on the fingerprint of the user.

In one or more embodiments, the projected area of the photosensitive portion 320 on the substrate 10 is larger than the projected area of the second opening 420 on the substrate 10, i.e., the area of the photosensitive portion 320 is increased as much as possible, so that the photosensitive portion 320 can receive as much as possible of the light that are incident to the photosensitive portion 320 from the second opening 420.

In step S70, a film encapsulation layer 50 and a touch layer 60 are formed on the cathode layer.

In step S80, a color filter layer 70 including a black matrix 710 and a color resist layer is formed on the touch layer 60. A plurality of third openings 711 and a plurality of fourth openings 712 are formed in the black matrix 710. The color resist layer includes a plurality of color resist blocks 721 respectively disposed within the plurality of third openings 711 and the plurality of fourth openings 712. The color resist block 721 within the third opening 711 is a blue color resist or a green color resist.

Figure 6E:
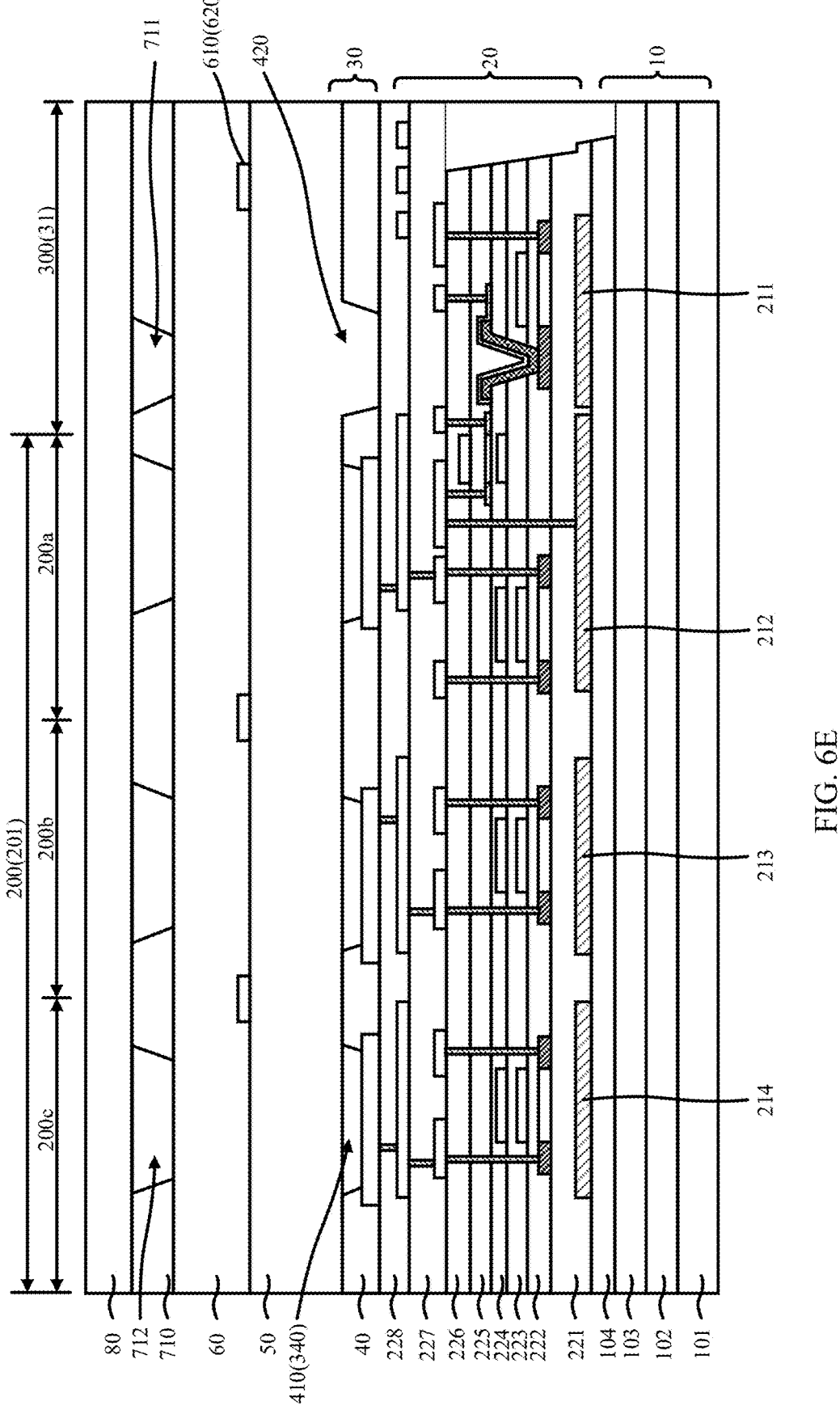

Referring to FIG. 6E, a center point of the third opening 711 and a center point of the second opening 420 may be located on the same straight line perpendicular to the display panel 100. The second opening 420 and the third opening 711 may form a collimated light path, and the light reflected by the user's finger may enter the photosensitive device 300 through the collimated light path, so that the photosensitive portion 320 can receive the light data and obtain information about the user's fingerprint.

In one or more embodiments, the diameter of the circumcircle of the third opening 711 may be smaller than the diameter of the circumcircle of the second opening 420. The decrease in the diameter of the circumcircle of the third opening 711 reduces the amount of external interference light entering the photosensitive device 300, while the increase in the diameter of the circumcircle of the second opening 420 allows as much incident light through the third opening 711 as possible to be directed into the photosensitive portion 320.

In one or more embodiments, the diameter of the circumcircle of the third opening 711 may be 2 μm to 20 μm, for example, the diameter of the circumcircle of the third opening 711 may be 4 μm to 10 μm, and the diameter of the circumcircle of the second opening 420 is larger than the diameter of the circumcircle of the third opening 711.

In one or more embodiments, the third opening 711 is filled with a color resist block 721, and the color resist block 721 in the third opening 711 is a blue color resist or a green color resist. The provision of the blue color resist or the green color resist is mainly used to filter the red light reflected by the user's finger.

In one or more embodiments, the display panel 100 further includes a layer of cover 80 provided on the color filter layer 70.

One or more embodiments of the present application provide a display device comprising a terminal body and the above-described display panel that are combined. The terminal body may be a device such as a circuit board bound to the display panel. The display device may include an electronic device such as a cell phone, a television, a laptop computer, or the like.

In the above embodiments, the description of each embodiment has its own focus. For the part that is not detailed in a certain embodiment, the relevant description of other embodiments can be referred to.

Some embodiments of the present application have been described in detail above. The description of the above embodiments merely aims to help to understand the present application. Many modifications or equivalent substitutions with respect to the embodiments may occur to those of ordinary skill in the art based on the present application. Thus, these modifications or equivalent substitutions shall fall within the scope of the present application.

What is claimed is:

1. A display panel, having light-emitting areas and at least one non-light-emitting area between the light-emitting areas, the display panel comprising:

a substrate;

a first semiconductor layer provided on a side of the substrate, wherein the first semiconductor layer comprises a first active portion provided in each of the light-emitting areas and a first electrode provided in the non-light-emitting area, the first active portion comprises a first semiconductor material, and the first electrode comprises the first semiconductor material that is conductorized;

an insulating isolation layer provided on a side of the first semiconductor layer away from the substrate, wherein the insulating isolation layer comprises a first opening provided in the non-light-emitting area to correspond to the first electrode, and the first opening exposes a surface of the first electrode on a side away from the substrate;

a photosensitive layer provided on a side of the insulating isolation layer away from the substrate, wherein the photosensitive layer comprises a photosensitive portion provided corresponding to the first opening;

a second semiconductor layer provided on a side of the insulating isolation layer and the photosensitive layer away from the substrate, wherein the second semiconductor layer comprises a second active portion provided in the each of the light-emitting areas and a second electrode provided corresponding to the first opening, the second active portion comprises a second semiconductor material, the second electrode comprises the second semiconductor material that is conductorized, and the photosensitive portion is provided between the first electrode and the second electrode; and a light-emitting layer provided on a side of the second semiconductor layer away from the substrate, wherein the light-emitting layer comprises one or more light-emitting devices provided in the each of the light-emitting areas.

2. The display panel of claim 1, further comprising:

a photosensitive drive transistor provided in the non-light-emitting area, wherein the first semiconductor layer further comprises a drive active portion of the photosensitive drive transistor, and the drive active portion comprises a drive channel, and a source connecting portion and a drain connecting portion provided respectively on both sides of the drive channel, and wherein the drain connecting portion is electrically connected to a drain of the photosensitive drive transistor, and at least part of the source connecting portion is serves as the first electrode; or, the source connecting portion is electrically connected to a source of the photosensitive drive transistor, and at least part of the drain connecting portion serves as the first electrode.

3. The display panel of claim 2, wherein the second electrode is a transparent electrode formed of transparent material.

4. The display panel of claim 2, wherein the photosensitive portion overlaps a sidewall of the first opening and is connected to the first electrode through the first opening.

5. The display panel of claim 2, wherein a sidewall of the first opening is angled at an acute angle of 30° to 80° with respect to the substrate.

6. The display panel of claim 2, further comprising:

a pixel-defining layer provided on the second semiconductor layer, wherein a second opening corresponding to the photosensitive portion is formed in the pixel-defining layer; and the second opening is filled with an insulating material, and an orthographic projection of the insulating material within the second opening on the photosensitive layer is within the photosensitive portion.

7. The display panel of claim 6, wherein a projected area of the photosensitive portion on the substrate is greater than a projected area of the second opening on the substrate.

8. The display panel of claim 6, further comprising:

a color filter layer provided on the pixel-defining layer, wherein a third opening corresponding to the second opening is formed in a black matrix of the color filter layer, and a diameter of a circumcircle of the third opening is smaller than a diameter of a circumcircle of the second opening.

9. The display panel of claim 8, wherein the diameter of the circumcircle of the third opening is of 2 μm to 20 μm.

10. The display panel of claim 8, wherein a plurality of fourth openings respectively corresponding to the light-emitting devices are formed in the black matrix and, each of the plurality of fourth openings is filled with a first color resist block; and wherein a diameter of a circumcircle of each of the fourth openings is larger than the diameter of the circumcircle of the third opening.

11. The display panel of claim 10, wherein the third opening is filled with a second color resist block, and the second color resist block comprises one of a blue color resist and a green color resist.

12. The display panel of claim 8, further comprising:

a touch metal layer between the pixel-defining layer and the color filter layer, wherein the touch metal layer comprises a plurality of first conductors and a plurality of second conductors, the first conductors and the second conductors constituting touch electrodes; and respective orthographic projections of the plurality of first conductors and the plurality of second conductors on the color filter layer are within the black matrix.

13. The display panel of claim 2, wherein a first sub-pixel is provided in the each of the light-emitting areas, the first sub-pixel comprising a first pixel driving portion; and the first pixel driving portion comprises:

the first active portion comprising a first channel and first conductor portions provided respectively on both sides of the first channel; and the second active portion comprising a second channel and second conductor portions provided respectively on both sides of the second channel, wherein an orthographic projection of the first active portion on the substrate has no overlap with an orthographic projection of the second active portion on the substrate; and the first active portion and the first electrode are provided on a surface of a first insulating film layer, and the second active portion and at least part of the second electrode are provided on a surface of a second insulating film layer.

14. The display panel of claim 13, further comprising a first light-shielding portion provided in the non-light-emitting area and between the drive active portion and the substrate, wherein an orthographic projection of each of the photo-sensitive portion and the drive channel on the first light-shielding portion is within the first light-shielding portion.

15. The display panel of claim 14, wherein the first sub-pixel further comprises a second light-shielding portion provided between the substrate and the first active portion, wherein an orthographic projection of the first active portion on the second light-shielding portion is within the second light-shielding portion; and the first light-shielding portion and the second light-shielding portion are provided on a surface of a third insulating film layer and spaced apart from each other.

16. The display panel of claim 15, wherein an ortho-graphic projection of the second active portion on the second light-shielding portion is within the second light-shielding portion.

17. The display panel of claim 15, wherein an ortho-graphic projection of the second active portion on the first light-shielding portion is within the first light-shielding portion.

18. The display panel of claim 13, wherein a length of the first channel is greater than a length of the drive channel.

19. The display panel of claim 1, wherein the first semiconductor material comprises one of low-temperature polysilicon and metal oxide, and the second semiconductor material comprises an other one of the low-temperature polysilicon and the metal oxide.

20. A display device, comprising a display panel having light-emitting areas and at least one non-light-emitting area between the light-emitting areas, wherein the display panel comprises:

a substrate;

a first semiconductor layer provided on a side of the substrate, wherein the first semiconductor layer comprises a first active portion provided in each of the light-emitting areas and a first electrode provided in the non-light-emitting area, the first active portion comprises a first semiconductor material, and the first electrode comprises the first semiconductor material that is conductorized;

an insulating isolation layer provided on a side of the first semiconductor layer away from the substrate, wherein the insulating isolation layer comprises a first opening provided in the non-light-emitting area to correspond to the first electrode, and the first opening exposes a surface of the first electrode on a side away from the substrate;

a photosensitive layer provided on a side of the insulating isolation layer away from the substrate, wherein the photosensitive layer comprises a photosensitive portion provided corresponding to the first opening;

a second semiconductor layer provided on a side of the insulating isolation layer and the photosensitive layer away from the substrate, wherein the second semiconductor layer comprises a second active portion provided in the each of the light-emitting areas and a second electrode provided corresponding to the first opening, the second active portion comprises a second semiconductor material, the second electrode comprises the second semiconductor material that is conductorized, and the photosensitive portion is provided between the first electrode and the second electrode; and a light-emitting layer provided on a side of the second semiconductor layer away from the substrate, wherein the light-emitting layer comprises one or more light-emitting devices provided in the each of the light-emitting areas.

\* \* \* \* \*